(12) United States Patent
Billmann et al.

(10) Patent No.: US 9,210,826 B2
(45) Date of Patent: Dec. 8, 2015

(54) POWER SEMICONDUCTOR MODULE HAVING LAYERED INSULATING SIDE WALLS

(75) Inventors: Markus Billmann, Emskirchen (DE); Christoph Bloesch, Bebenreuth (DE); Dirk Malipaard, Nuremberg (DE); Andreas Zenkner, Obermichelbach (DE)

(73) Assignees: Siemens Aktiengesellschaft, Munich (DE); Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 211 days.

(21) Appl. No.: 13/256,275

(22) PCT Filed: Mar. 13, 2009

(86) PCT No.: PCT/EP2009/002056
§ 371 (c)(1),
(2), (4) Date: Sep. 13, 2011

(87) PCT Pub. No.: WO2010/102654
PCT Pub. Date: Sep. 16, 2010

(65) Prior Publication Data
US 2012/0001317 A1 Jan. 5, 2012

(51) Int. Cl.
*H01L 23/48* (2006.01)
*H05K 7/14* (2006.01)
(Continued)

(52) U.S. Cl.
CPC ............ *H05K 7/1432* (2013.01); *H01L 25/072* (2013.01); *H01L 23/04* (2013.01); *H01L 23/10* (2013.01); *H01L 23/49838* (2013.01); *H01L 2924/0002* (2013.01)

(58) Field of Classification Search
CPC .................... H01L 23/10; H01L 23/49838
USPC .......... 361/728, 729, 730; 257/710, E23.193
See application file for complete search history.

(56) References Cited

U.S. PATENT DOCUMENTS 5,982,031 A 11/1999 Stockmeier
6,295,205 B1 9/2001 Lang et al.
(Continued)

FOREIGN PATENT DOCUMENTS

CN 1428849 A 7/2003
DE 19839422 A1 3/2000
(Continued)

OTHER PUBLICATIONS

Nagorny, Database WPI Week 198632, Thomson Scientific, London, GB, AN 1986-211048.

*Primary Examiner* — Colleen A Matthews
*Assistant Examiner* — William Harriston
(74) *Attorney, Agent, or Firm* — Laurence A. Greenberg; Werner H. Stemer; Ralph E. Locher

(57) ABSTRACT

A power semiconductor module includes at least two interconnected power semiconductor units having actuatable power semiconductors, a module housing in which the power semiconductor units are disposed and which has an electrically insulating side wall, and at least one connection bus extended through the side wall and connected to at least one of the power semiconductor units. High explosion resistance and particularly inexpensive production are provided by forming the insulating side wall as a stack of insulating and partial elements constructed as a single piece, in which contact areas of the partial elements contact each other.

9 Claims, 2 Drawing Sheets

(51) Int. Cl.
*H01L 25/07* (2006.01)
*H01L 23/04* (2006.01)
*H01L 23/498* (2006.01)
*H01L 23/10* (2006.01)

(56) References Cited

U.S. PATENT DOCUMENTS

| | | |
|---|---|---|
| 6,734,543 B2 | 5/2004 | Meysenc et al. |
| 7,005,739 B2 | 2/2006 | Kaufmann et al. |
| 7,327,024 B2 | 2/2008 | Stevanovic et al. |
| 2006/0139903 A1* | 6/2006 | Takagi .................. 361/764 |
| 2008/0303052 A1* | 12/2008 | Lee et al. .................. 257/99 |
| 2009/0250799 A1 | 10/2009 | Billmann et al. |
| 2010/0265744 A1* | 10/2010 | Dorn et al. .................. 363/123 |

FOREIGN PATENT DOCUMENTS

| | | |
|---|---|---|
| EP | 1662568 A2 | 5/2006 |
| RU | 2210837 C2 | 8/2003 |
| RU | 2302685 C2 | 7/2007 |
| SU | 1202088 A1 | 12/1985 |
| WO | 2008031372 A1 | 3/2008 |

* cited by examiner

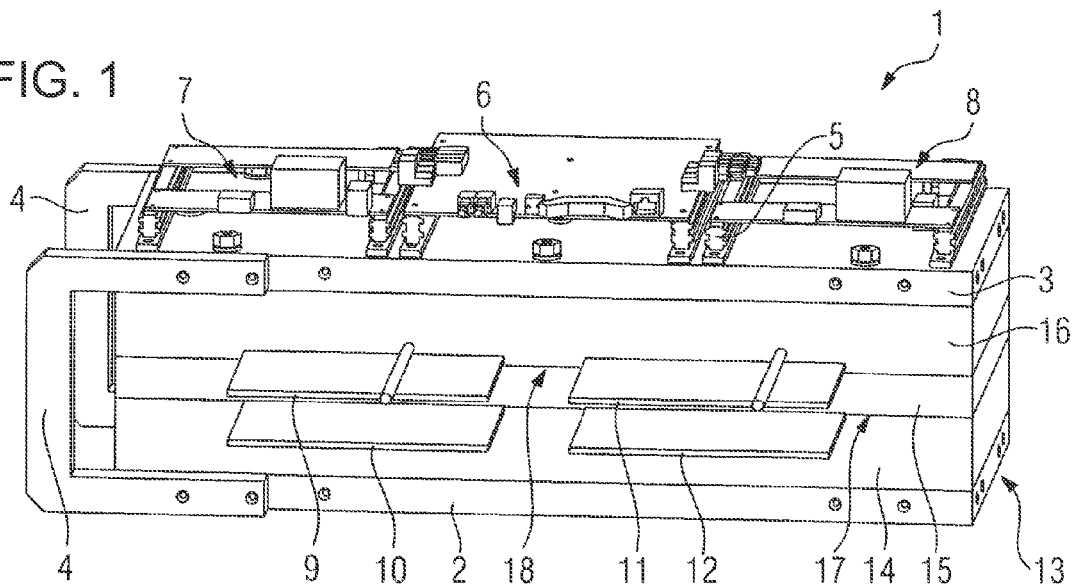
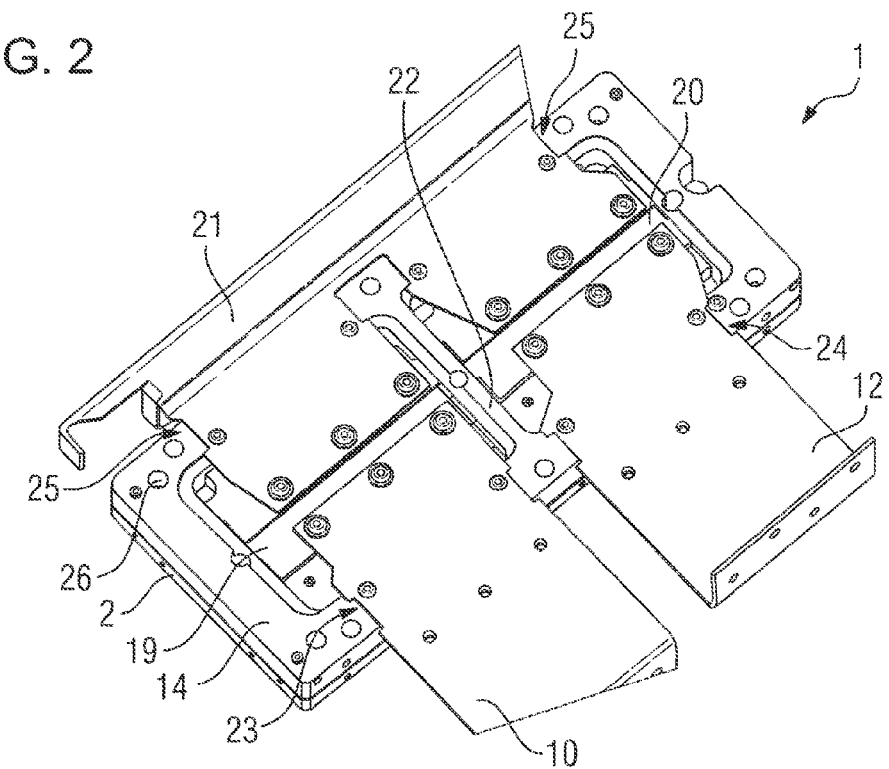

POWER SEMICONDUCTOR MODULE HAVING LAYERED INSULATING SIDE WALLS

BACKGROUND OF THE INVENTION

Field of the Invention

The invention relates to a power semiconductor module having at least two interconnected power semiconductor units comprising switchable power semiconductors, a module housing in which the power semiconductor units are disposed and which has an electrically insulating side wall, and at least one connecting bar which extends through the side wall and is connected to at least one of the power semiconductor units.

Such a power semiconductor module is already disclosed, for example, in WO 2008/031372. The power semiconductor module disclosed therein has two interconnected power semiconductor units. Each power semiconductor unit has a multiplicity of power semiconductor chips, such as for example IGBTs, GTOs or the like, which are connected to one another and are disposed in their own unit housing. Each power semiconductor unit forms an anode and cathode and a control connection. The current flow between anode and cathode can be interrupted or permitted with the help of suitable control signals on the control connection. At least two of said power semiconductor units are disposed in a separate module housing, which serves to provide explosion protection. The current path from the power semiconductor units is fed to the outside by means of an expedient bar arrangement which passes through the walls of the module housing.

BRIEF SUMMARY OF THE INVENTION

The object of the invention is to provide a power semiconductor module of the kind mentioned in the introduction which has a high explosion resistance and is particularly inexpensive to produce.

The invention achieves this object in that the insulating side wall is constructed as a stack of insulating partial elements designed as a single piece, wherein contact areas of the partial elements rest against one another.

According to the invention, power semiconductor units which at least have switchable power semiconductors, such as for example IGBTs, GTOs, thyristors or the like, are disposed in an explosion-proof module housing. At the same time, as well as an anode and a cathode connection, the switchable power semiconductor units also have a control connection to switch the current flow via anode and cathode of the controllable power semiconductor. At least one connecting bar, which passes through the insulating side wall of the module housing, is provided to feed the current path via the power semiconductor units out of the module housing.

In the power distribution field, for example in high voltage direct current transmission (HVDC transmission) or in so-called "Flexible AC Transmission Systems (FACTS)", it is usual to transform high alternating voltages into direct voltages or vice versa. Although, as a rule, a multiplicity of power semiconductor modules according to the invention are connected in series for this purpose, a high voltage is dropped across each of the individual power semiconductor modules in spite of the series connection. Particularly in the event of a fault, this high voltage can lead to explosive destruction of the power semiconductor units. The module housing is used for safety purposes so that the explosion gases which escape from the module housing in the event of an explosion can be safely contained or dissipated. In this way, damage to other power semiconductor modules can be avoided.

In order to guarantee an inexpensive production of such power semiconductor modules, according to the invention it is proposed to design the insulating side wall of the power semiconductor module, through which a plurality of connecting bars for making contact with the power semiconductor units located in the interior of the module housing extend, from a plurality of partial elements which are stacked on top of one another. The partial elements themselves are made from an electrically insulating material. When the power semiconductor module according to the invention is in operation, the stacked partial elements rest against one another so that butt joints, which make it significantly easier to remove the connecting bar(s) from the module housing, are defined between them.

According to the invention, for example, first a partial element followed by a connecting bar, then a further partial element, then a further connecting bar, which must be mounted in an insulated manner from the said first bar, and finally a further partial element can be stacked on top of one another. The connecting bar is connected to the required power semiconductor units. When the power semiconductor module is in operation, the current path, which is at a high-voltage potential, therefore leads via a connecting bar into the module housing, via the power semiconductor units disposed therein and from there back out of the module housing via a further connecting bar.

According to a preferred embodiment of the invention, the partial elements are designed to be circumferentially closed. This provides even higher explosion resistance, wherein the production costs still remain low.

The partial elements can be produced as closed or ring-shaped partial elements independently of the rest of the module housing. This avoids elaborate jointing methods in the assembly of the side wall.

Advantageously, the partial elements have at least one reinforcing rib. In the case of a ring-shaped circumferentially closed partial element for example, the reinforcing rib extends between two opposing boundary walls. Expediently, the partial segments and, if applicable, the reinforcing rib(s) border cavities or parts of a cavity in which the power semiconductor units are disposed in the assembled state of the power semiconductor module.

Advantageously, at least one of the connecting bars extends through the side wall between two partial elements. In other words, each connecting bar extends through a butt joint.

According to an expedient improvement in this regard, one of the partial elements has a cutout in its contact area, through which the connecting bar extends. The assembly of the power semiconductor module is even further simplified with the help of this cutout. The partial element with the cutout can first be connected to the rest of the power semiconductor module and the bar then fitted.

Expediently, the cutouts and the connecting bar which extends through them are designed with a complementary shape to one another. The complementary shaped design substantially prevents the escape of explosion gases in the event of a fault. The side wall encloses each connecting bar to provide a seal. In this way, explosion damage can be further minimized.

Advantageously, the partial elements are made of a fiber-reinforced plastic. As a result of the fiber reinforcement, the plastic is particularly explosion resistant. Fiber-reinforced plastics are very well known so it is not necessary to go into their chemical composition in more detail here. In particular, consideration is given to glass-fiber-reinforced plastics.

Advantageously, each power semiconductor unit has power semiconductor chips and a unit housing in which the power semiconductor chips are disposed. Such power semiconductor units are available on the market and can be obtained particularly inexpensively. This therefore further reduces the costs of the power semiconductor module according to the invention.

According to an expedient improvement in this regard, the power semiconductor chips are connected to one another by means of bonding wires. By connecting them with the help of bonding wires, the costs are further reduced.

According to a preferred embodiment of the invention, the insulating side wall extends between a base plate and a cover plate, wherein the base plate and/or the cover plate are designed as a cooling plate. In other words, the base plate or the cover plate is made from a material with high thermal conductivity, for example a metal such as aluminum or the like.

Further expedient embodiments and advantages of the invention are the subject matter of the following description of exemplary embodiments of the invention with reference to the figures of the drawing, wherein the same references refer to similarly acting components, and wherein

BRIEF DESCRIPTION OF THE SEVERAL VIEWS OF THE DRAWING

FIG. 1 shows an exemplary embodiment of the power semiconductor module according to the invention;

FIG. 2 shows the power semiconductor module according to FIG. 1 during assembly;

DESCRIPTION OF THE INVENTION

Figure 3:
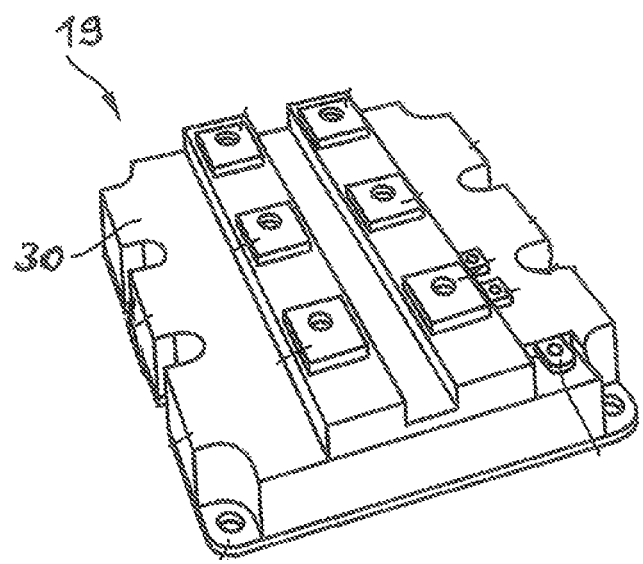
FIG. 3 shows a power semiconductor unit with a unit housing.

FIG. 1 shows an exemplary embodiment of the power semiconductor module according to the invention in a perspective view. The power semiconductor module 1 has a bottom base plate 2 and a top cover plate 3, which are each made from a metallic material, in this case aluminum. The base plate 2 and the cover plate 3 are in thermally conducting contact with power semiconductor units, which are not visible in FIG. 1, so that they act as cooling plates due to the high thermal conductivity. In order to improve the cooling performance of the cooling plates 2, 3, they are in thermally conducting contact with one another via U-shaped thermal bridges 4.

Plastic supports 5, on which in turn control units 6, 7, 8 are disposed, are provided on the cover plate 3. The control units 6, 7, 8 provide control signals for the power semiconductor units which are disposed in the interior of the power semiconductor module 1 so that they can be specifically switched from a blocking state, in which a current flow via the switched power semiconductor unit is interrupted, into a conducting state, in which a current flow via the respective power semiconductor unit is enabled. In the conducting state, the current flows from an anode of the respective power semiconductor unit to its cathode.

In the case of power semiconductor units which can be turned off, such as IBGTs, GTOs or the like, these can be switched from the conducting state to the blocking state with the help of the control signal. In the case of power semiconductor units with power semiconductors which can be turned off, the power semiconductor units in each case have a freewheel diode which is connected in anti-parallel with the respective power semiconductor which can be turned off.

Within the scope of the invention, the power semiconductor units of the power semiconductor module 1 can be connected to one another and to connecting bars 9, 10, 11 and 12 via their anode and/or cathode in any manner. At the same time, the power semiconductor units of the power semiconductor module 1 can be controlled, for example, so that a current flow between the connecting bars 9 and 10 which are fed out is enabled or interrupted.

A side wall 13, which is made of an electrically insulating material, for example a glass-fiber-reinforced plastic, extends between the base plate 2 and the cover plate 3. The base plate 2, the cover plate 3 and the side wall 13 therefore form a module housing which, in the event of an explosion of the power semiconductor units, acts as protection for the remaining power semiconductor modules and/or for operating personnel.

Within the scope of the invention, the side wall 13 is not designed in one piece but structured in layers. It comprises a plurality of partial elements 14, 15 and 16 which are stacked on top of one another and contact areas of which rest against one another, thus providing a boundary for butt joints 17 and 18. The stacked structure of the side wall 13 enables the side wall 13 to be easily assembled, as the partial elements 14, 15, 16 and the connecting bars 9, 10, 11 and 12 which pass through the side wall 13 can be assembled in any order.

FIG. 2 shows a snapshot of the power semiconductor module 1 during assembly. It can be seen that the partial element 14 and two power semiconductor units 19, 20 are connected to the base plate 2. An angular DC connecting bar 21, which is likewise connected to the power semiconductor units 19, 20, can also be seen. Two further power semiconductor units, which are not visible in FIG. 2, are mounted on the cover plate 13, wherein the connecting bars 9, 10, 11, 12 and 21 are provided for making contact with the power semiconductor units 19, 20 from the outside. Overall, the power semiconductor module 1 has four power semiconductor units 19, 20, which in the exemplary embodiment shown are connected as a full bridge, or in other words as an H-bridge, to one another and to a capacitor which is not shown in FIG. 2. By appropriate switching of the power semiconductor units, the voltage $U_c$ dropped across the capacitor, a zero voltage or the inverse capacitor voltage $-U_c$ can therefore be switched to the two-pole output of the power semiconductor unit.

In FIG. 2 it can further be seen that the partial element 14 is designed to be circumferentially closed, i.e. in the form of a ring, wherein a reinforcing rib 22 extends between two opposing sides. Two cavities, in which a power semiconductor unit 19 or 20 respectively is disposed in each case, are formed between the reinforcing rib 22 and the outer walls of the partial element 14. Furthermore, it can be seen that the partial element 14 has cutouts 23, 24 and 25 which are designed with a complementary shape to the respective connecting bar 10, 12 and 21 respectively. This complementary shaped design at least hinders the escape of hot gases which occur in the interior of the power semiconductor module 1 in the event of an explosion.

In order to mechanically clamp the cover plate 3 to the base plate 2 and therefore the partial elements 14, 15, 16, as shown in FIG. 2 each partial element 14, 15, 16 has a plurality of fixing holes 26, through which threaded fixing bolts extend in the assembled state of the power semiconductor module 1. Screwing the fixing bolts to the cover plate 3 and the base plate 2 provides a power semiconductor module 1 which is inexpensive and explosion resistant.

Figure 4:
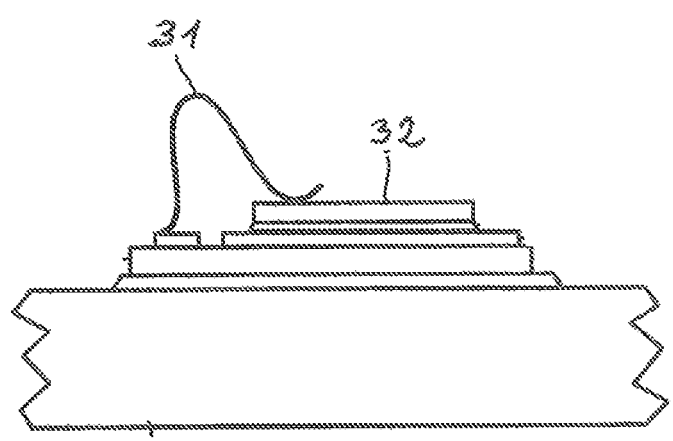
FIG. 4 shows a schematic side view of a power semiconductor chip 32.

FIG. 3 shows a power semiconductor unit 19 with a unit housing 30. The power semiconductor chips are arranged within the unit housing 30. FIG. 4 shows a schematic side view of a power semiconductor chip 32. The power semiconductor chip 32 is connected to other semiconductor chips by bonding wires 31.

The invention claimed is:

1. A power semiconductor module, comprising:
   a module housing having an electrically insulating side wall, said insulating side wall being entirely constructed as a stack of insulating partial elements formed as a single piece, said partial elements having contact areas resting against one another;
   at least two interconnected power semiconductor units disposed in said module housing and having switchable power semiconductors; and
   at least one connecting bar extended through said side wall and connected to at least one of said power semiconductor units;
   said partial elements being circumferentially closed.

2. The power semiconductor module according to claim 1, wherein said partial elements have at least one reinforcing rib.

3. The power semiconductor module according to claim 1, wherein one said at least one connecting bar is extended through said side wall between two of said partial elements.

4. The power semiconductor module according to claim 1, wherein said contact area of at least one of said partial elements has a cutout formed therein through which one said at least one connecting bar extends.

5. The power semiconductor module according to claim 1, wherein said cutout and said one connecting bar extended through said cutout have mutually complementary shapes.

6. The power semiconductor module according to claim 1, wherein said partial elements are formed of a fiber-reinforced plastic.

7. The power semiconductor module according to claim 1, wherein each of said power semiconductor units has power semiconductor chips and a unit housing in which said power semiconductor chips are disposed.

8. The power semiconductor module according to claim 7, which further comprises bonding wires interconnecting said power semiconductor chips.

9. The power semiconductor module according to claim 1, which further comprises a base plate and a cover plate, at least one of said base plate and said cover plate being constructed as a cooling plate, and said insulating side wall being extended between said base plate and said cover plate.

* * * * *